(12) United States Patent
Pan et al.

(10) Patent No.: US 10,972,075 B2
(45) Date of Patent: Apr. 6, 2021

(54) ACTIVE QUADRATURE CIRCUITS FOR HIGH FREQUENCY APPLICATIONS

(71) Applicant: GM Global Technology Operations LLC, Detroit, MI (US)

(72) Inventors: Hsuanyu Pan, Los Angeles, CA (US); Alexandros Margomenos, Pasadena, CA (US); Hasan Sharifi, Agoura Hills, CA (US); Igal Bilik, Rehovot (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 395 days.

(21) Appl. No.: 15/776,179

(22) PCT Filed: Dec. 11, 2015

(86) PCT No.: PCT/US2015/065378
§ 371 (c)(1),
(2) Date: May 15, 2018

(87) PCT Pub. No.: WO2017/099812
PCT Pub. Date: Jun. 15, 2017

(65) Prior Publication Data
US 2020/0266801 A1  Aug. 20, 2020

(51) Int. Cl.
*H03K 3/012* (2006.01)
(52) U.S. Cl.
CPC .................. *H03K 3/012* (2013.01)
(58) Field of Classification Search
CPC .......................... H03K 3/012; H02B 27/00
See application file for complete search history.

(56) References Cited

U.S. PATENT DOCUMENTS

| 4,528,697 | A | 7/1985 | Nichols |
| 5,320,481 | A | 6/1994 | Suzuki |
| 5,448,196 | A | 9/1995 | Kanbara et al. |
| 6,545,517 | B2 * | 4/2003 | Asam ............... H03K 3/012 327/115 |
| 6,782,249 | B1 | 8/2004 | Feldman |
| 7,164,330 | B2 | 1/2007 | Eom |
| 7,276,993 | B2 | 10/2007 | York |
| 7,342,987 | B2 | 3/2008 | Ashida |

(Continued)

OTHER PUBLICATIONS

International Search Report and Written Opinion for PCT Application No. PCT/US2015/065378, dated Aug. 24, 2016, pp. 1-10.

*Primary Examiner* — Diana J. Cheng
(74) *Attorney, Agent, or Firm* — Cantor Colburn LLP

(57) ABSTRACT

An active quadrature generation circuit configured to provide an in-phase output signal and a quadrature output signal based on an input signal and a method of fabricating the active quadrature generation circuit on an integrated circuit are described. The circuit includes an input node to receive the input signal and a first transistor including a collector connected to a power supply pin. The circuit also includes a second transistor including a base connected to the power supply pin, the second transistor differing in size from the first transistor by a factor of K, wherein the in-phase output signal and the quadrature output signal are generated based on an inherent phase difference of 90 degrees between a current at a collector of the first transistor and a current at a base of the second transistor.

14 Claims, 2 Drawing Sheets

(56) References Cited

U.S. PATENT DOCUMENTS

| | | |
|---|---|---|
| 7,463,108 B2 | 12/2008 | Horng et al. |
| 7,576,584 B2 | 8/2009 | Jeffries et al. |
| 7,612,621 B2 | 11/2009 | Kim et al. |
| 7,773,959 B1 | 8/2010 | Bachhuber et al. |
| 8,243,855 B2 | 8/2012 | Zarei |
| 8,248,302 B2 | 8/2012 | Tsai et al. |
| 8,253,466 B2 | 8/2012 | Jeffries et al. |
| 8,532,236 B2 | 9/2013 | Kerth |
| 8,554,267 B2 | 10/2013 | Salvi |
| 2009/0279642 A1 | 11/2009 | Zarei |
| 2009/0291649 A1 | 11/2009 | Fortier et al. |
| 2011/0227612 A1 | 9/2011 | Chiesa |
| 2015/0015431 A1* | 1/2015 | Trotta .................. G01S 7/03 342/21 |

* cited by examiner

ACTIVE QUADRATURE CIRCUITS FOR HIGH FREQUENCY APPLICATIONS

CROSS REFERENCE TO RELATED APPLICATIONS

This is a U.S. National Stage of PCT Application No. PCT/US2015/065378, filed on Dec. 11, 2015, the disclosure of which is incorporated herein in its entirety by reference.

FIELD OF THE INVENTION

The subject invention relates to an active quadrature circuit for high-frequency applications.

BACKGROUND

Quadrature generation circuits that generate in-phase (I) and quadrature (Q) (quarter cycle or 90 degrees out of phase) output signals from an input signal have many applications. For example, a quadrature generation circuit may be used in a phase shifter system. Quadrature generation may be implemented with passive or active elements. An exemplary quadrature generation circuit that uses passive elements is a resistor-capacitor (RC) circuit. When resistors are manufactured for use in RC circuits, the resistors exhibit variations in their value. This process variation results in an issue of variation in the resulting RC circuits and, consequently, accuracy. Quadrature generation circuits that use active elements consume significant power. Accordingly, it is desirable to provide an active quadrature generation circuit that avoids the accuracy issues of passive elements while consuming less power.

SUMMARY OF THE INVENTION

In one exemplary embodiment, an active quadrature generation circuit configured to provide an in-phase output signal and a quadrature output signal based on an input signal includes an input node configured to receive the input signal; a first transistor including a collector connected to a power supply pin; and a second transistor including a base connected to the power supply pin, the second transistor differing in size from the first transistor by a factor of K, wherein the in-phase output signal and the quadrature output signal are generated based on an inherent phase difference of 90 degrees between a current at a collector of the first transistor and a current at a base of the second transistor.

In another exemplary embodiment, a method of fabricating an active quadrature generation circuit on an integrated circuit includes arranging an input node to receive the input signal; arranging a first transistor such that a collector of the first transistor is connected to a power supply pin of the integrated circuit; arranging a second transistor such that a base of the second transistor is connected to the power supply pin; sizing the second transistor to be a factor of K of a size of the first transistor; and generating an in-phase output signal and a quadrature output signal from the input signal based on an inherent phase difference of 90 degrees between a current at the collector of the first transistor and a current at the base of the second transistor.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
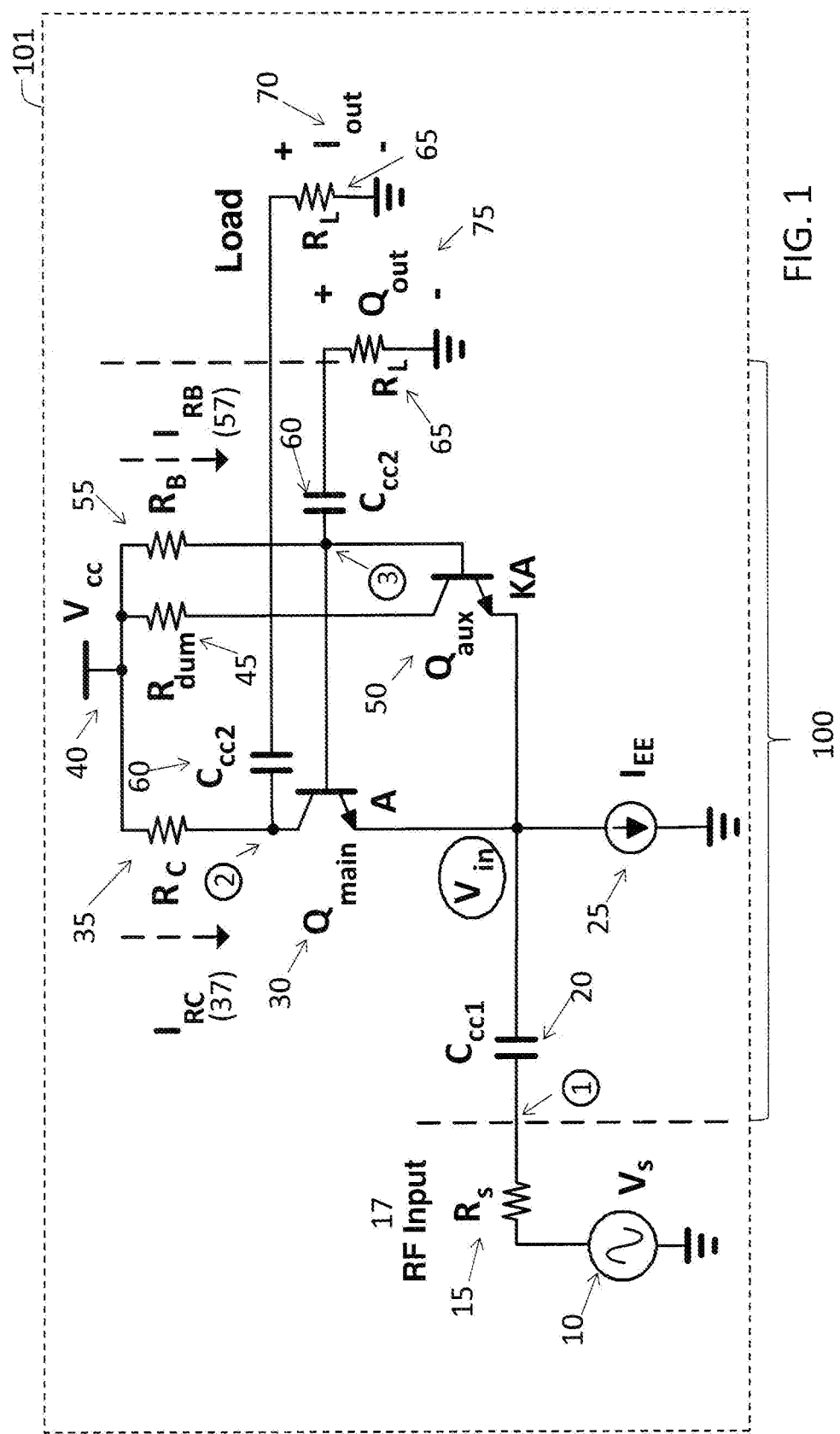
FIG. 1 is a circuit diagram of a single-end, active, internally matched, quadrature generation circuit according to an embodiment.

The following description is merely exemplary in nature and is not intended to limit the present disclosure, its application or uses. It should be understood that throughout the drawings, corresponding reference numerals indicate like or corresponding parts and features.

Embodiments discussed herein relate to active quadrature generation circuits that consume less power than traditional quadrature generation circuits that use active elements. The quadrature generation circuits according to the embodiments detailed herein rely on inherent characteristics of transistors for quadrature generation.

In accordance with an exemplary embodiment of the invention, a single-end, active, internally matched, quadrature generation circuit 100 is shown in FIG. 1. A voltage source Vs 10 and source impedance Rs 15 present a radio frequency (RF) input 17 at node 1, at the input to the quadrature generation circuit 100. The quadrature generation circuit 100, according to the embodiment shown in FIG. 1, includes a capacitor Ccc1 20 to isolate the dc bias at Vs 10. The two bipolar junction transistors (BJTs) Qmain 30, Qaux 50 that are part of the quadrature generation circuit 100 are of different sizes. Specifically, a scaling factor K is used to change the size of Qaux 50 from that of Qmain 30. That is, K is the size ration between transistors Qmain 30 and Qaux 50. The tail current source $I_{EE}$ 25 at the emitter of Qmain 30 and Qaux 50 provides the DC bias current of Qmain 30 and Qaux 50. The collector supply voltage (Vcc) 40 is a power supply pin of the integrated circuit 101 on which the quadrature generation circuit 100 is formed. When an RF input 17 is applied to the quadrature generation circuit 100, a corresponding RF current IRC 37 is generated and flows through collector resistor ($R_C$) 35 to the collector of the first transistor Qmain 30 at node 2. The other RF corresponding current $I_{RB}$ 57 is also generated and flows through base resistor (RB) 55 to the base of the second transistor Qaux 57 at node 3. The phase difference between $I_{RC}$ 37 and $I_{RB}$ 57 is 90 degrees at higher frequencies (on the order of gigahertz (GHz) to several ten GHz). Resistor Rdum 45 is at the collector of Qaux 50. Rdum 45 may be adjusted to adjust the collector voltage of Qaux 50 (to match the biasing of Qmain 30 and Qaux 50). At the collector of Qmain 30 (at node 2) and at the base of Qaux 50 (at node 3), a dc-decoupled capacitor $C_{CC2}$ 60 is arranged in series with a load resistor $R_L$ 65. The in-phase output signal Iout 70 is across the $R_L$ 65 associated with node 2, and the quadrature phase output signal Qout 75 (90 degrees out of phase with Iout 70) is across the $R_L$ 65 associated with node 3.

The phase difference between the in-phase and quadrature output signals, Iout 70 and Qout 75, is ensured based on the transistor inherent characteristics of Qmain 30 and Qaux 50. When the (normalized) current gain between nodes 1 and 3 (RF input node and the node at the collector of Qmain 30) and the (normalized) current gain between nodes 1 and 2

(RF input node and the node at the base of Qaux 50) is equal or within 3 decibels (dB) of each other, then the output phase difference (phase difference between Iout 70 and Qout 75) is at or about 90 degrees. Perfect amplitude balance ($|I_{RC}|=|I_{RB}|$) occurs when the frequency f is given by:

$$f \approx \frac{f_T}{(K+1)} \quad [\text{EQ. 1}]$$

At higher frequencies, when $f \gg fT/\beta$ (where fT is cutoff frequency of the transistor (on the order of 100 GHz, for example), and $\beta$ is the dc gain current or collector current/base current), the ratio of $I_{RC}$ 37 to $I_{RB}$ 57 is given by:

$$\frac{I_{RC}}{I_{RB}} \approx -j\frac{f_T}{f} \times \frac{1}{(K+1)} \quad [\text{EQ. 2}]$$

As EQ. 2 illustrates, when EQ. 1 is true, then $$I_{RC} \approx -jI_{RB} \quad [\text{EQ. 3}]$$

That is, $I_{RC}$ 37 and $I_{RB}$ 57 are 90 degrees apart in phase. Further, the quadrature (90 degree) relationship is achieved by the inherent characteristics between the collector and base alternating current (AC) ($I_{RC}$ 37 to $I_{RB}$ 57). To achieve a wide-band matching, the resistor values are selected such that:

$$R_s \approx \frac{1}{(g_{m,Qmain} + g_{m,Qaux})} \quad [\text{EQ. 4}]$$

In EQ. 4, gm is the transconductance of the transistors Qmain 30 and Qaux 50. In order to match the load impedance, $R_L$ 65, $R_C$ 35, and $R_B$ 55 can be chosen as:

$$R_C \approx R_L \quad [\text{EQ. 5}]$$

$$R_B \approx R_L \quad [\text{EQ. 6}]$$

Figure 2:
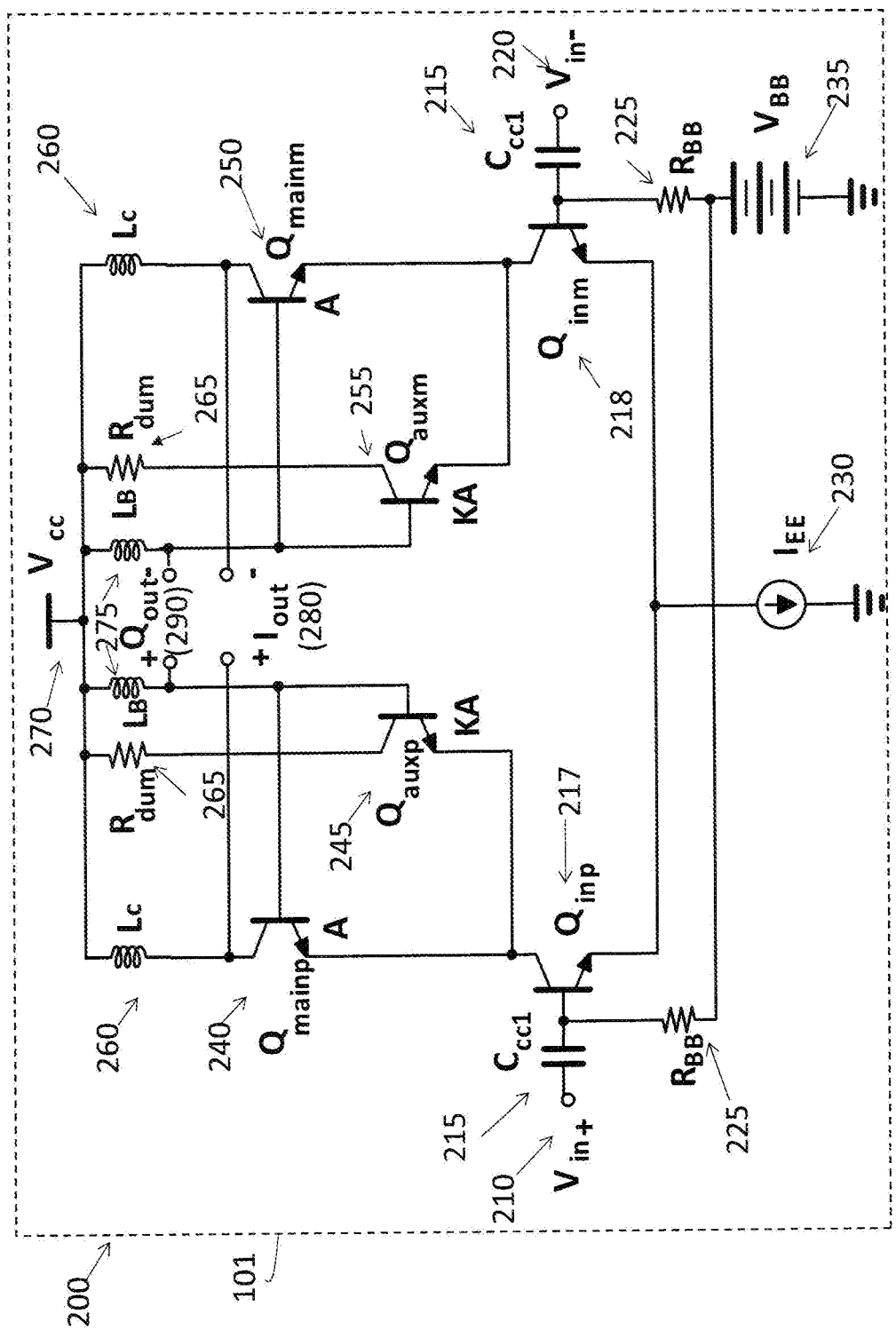
FIG. 2 is a circuit diagram of a differential quadrature generation circuit according to an embodiment.

In accordance with another exemplary embodiment of the invention, a differential, active, internally matched, quadrature generation circuit 200 is shown in FIG. 2. The differential voltage Vin+ 210 and Vin− 220 is converted to differential current. According to the current embodiment, Iout 280 and Qout 290 are differential outputs. Each side (p and m) of the differential quadrature generation circuit 200 includes three transistors. On the p side, these are Qinp 217, Qmainp 240, and Quxp 245. On them side, these are Qinm 218, Qmainm 250, and Qauxm 255. All of the transistors may be BJTs. On each side, a scaling factor is used to change the size of the auxiliary transistor from that of the main transistor. That is, a scaling factor K is used to change the size of Qauxp 245 from that of Qmainp 240 and the scaling factor K is also used to change the size of Qauxm 255 from that of Qmainm 250. The capacitors Ccc1 215 isolate the dc bias at the voltages Vin+ 210 and Vin− 220. At the base of Qinp 217 and Qinm 218, parallel resistors $R_{BB}$ 225 are in series with voltage source $V_{BB}$ 235 to provide the base bias voltages. The emitters of Qinp 217 and Qinm 218 connect to a current source $I_{EE}$ 230. The collector supply voltage (Vcc) 270 is a power supply pin of the integrated circuit 101 on which the quadrature generation circuit 200 is formed. As a comparison of FIG. 1 with FIG. 2 indicates, $R_C$ 35 and $R_B$ 55 are replaced with inductors $L_C$ 260 and $L_B$ 275. The inductors increase gain with less energy consumption at higher frequencies (e.g., 77 GHz). The resistor Rdum 265 is at the collector of each of Qauxp 245 and Qauxm 255. There is an inherent phase difference of 90 degrees between the collector of Qmainp 240 (associated with Iout+ 280) and the base of Qauxp 245 (associated with Qout+ 290). There is also an inherent phase difference of 90 degrees between the collector of Qmainm 250 (associated with Iout− 280) and the base of Qauxm 255 (associated with Qout− 290). As a result, a phase difference of 90 degrees is ensured between the in-phase and quadrature output signals, Iout 280 and Qout 290.

Some common features of the circuits according to the embodiments discussed with reference to FIG. 1 and FIG. 2 include temperature insensitivity. Other features, in addition to the 90 degree phase difference between the in-phase and quadrature outputs based on the inherent characteristics of the transistors, include amplitude balance near the frequency of interest (e.g., 24 GHz, 77 GHz, 22-29 GHz, 76-81 GHz). That is, the amplitude of the in-phase and quadrature outputs is nearly equal. In addition, both circuits provide good input and output matching at high frequencies. This prevents bounce-back of the RF input, for example. Also, the differential topology shown in FIG. 2 provides immunity to common-mode interferences. While the active circuits shown in FIG. 1 and FIG. 2 avoid the accuracy issues associated with passive quadrature circuits, they also avoid the high power consumption associated with traditional active element devices that include a divider and latch, for example.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. An active quadrature generation circuit configured to provide an in-phase output signal and a quadrature output signal based on an input signal, the circuit comprising:
    an input node configured to receive the input signal;
    a first transistor including a collector connected to a power supply pin; and
    a second transistor including a base connected to the power supply pin, the second transistor differing in size from the first transistor by a factor of K, wherein the in-phase output signal and the quadrature output signal are generated based on an inherent phase difference of 90 degrees between a current at a collector of the first transistor and a current at a base of the second transistor.

2. The circuit according to claim 1, wherein the input signal is a radio frequency (RF) signal.

3. The circuit according to claim 1, wherein the input node is a differential input node and the input signal is a differential signal.

4. The circuit according to claim 3, wherein a pair of the first transistor and the second transistor is associated with each side of the differential input node.

5. The circuit according to claim 3, wherein the in-phase output signal and the quadrature output signal are both differential signals.

6. The circuit according to claim 1, wherein an amplitude of the in-phase output signal and an amplitude of the quadrature output signal are balanced at a frequency of interest.

7. The circuit according to claim 6, wherein the frequency of interest is between 76 gigahertz (GHz) and 81 GHz.

8. The circuit according to claim 7, wherein the frequency of interest is 77 GHz.

9. The circuit according to claim 6, wherein the frequency of interest is between 22 gigahertz (GHz) and 29 GHz.

10. The circuit according to claim 9, wherein the frequency of interest is 24 GHz.

11. A method of fabricating an active quadrature generation circuit on an integrated circuit, the method comprising:
    arranging an input node to receive the input signal;
    arranging a first transistor such that a collector of the first transistor is connected to a power supply pin of the integrated circuit;
    arranging a second transistor such that a base of the second transistor is connected to the power supply pin;
    sizing the second transistor to differ by a factor of K from a size of the first transistor; and
    generating an in-phase output signal and a quadrature output signal from the input signal based on an inherent phase difference of 90 degrees between a current at the collector of the first transistor and a current at the base of the second transistor.

12. The method according to claim 11, wherein the arranging the input node to receive the input signal includes arranging a differential input node to receive a differential signal.

13. The method according to claim 12, further comprising arranging a pair of the first transistor and the second transistor associated with each side of the differential input node.

14. The method according to claim 12, wherein the generating the in-phase output signal and the quadrature output signal includes generating differential signals.

\* \* \* \* \*